Figure 3:
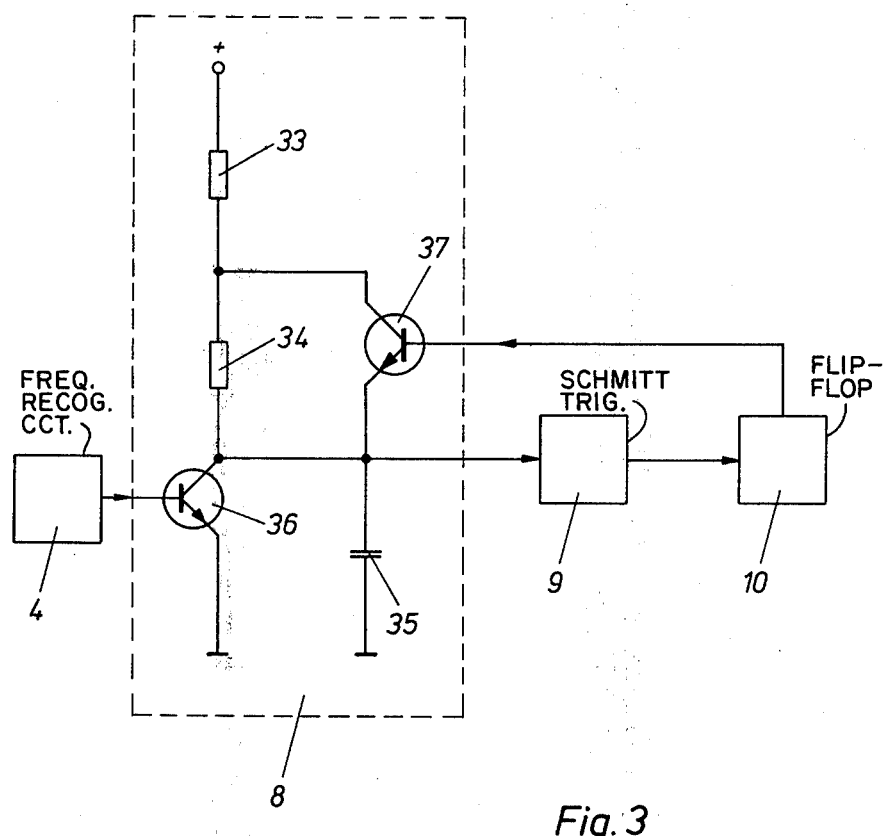

United States Patent [19]

Brägas et al.

[11] 4,024,475

[45] May 17, 1977

[54] DECODER FOR FREQUENCY-MODULATED TONES OF TWO DIFFERENT LENGTHS

[75] Inventors: Peter Brägas, Hildesheim; Uwe Mätzold, Salzgitter, both of Germany

[73] Assignee: Blaupunkt-Werke GmbH, Hildesheim, Germany

[22] Filed: May 14, 1976

[21] Appl. No.: 686,519

[30] Foreign Application Priority Data

June 23, 1975 Germany .......................... 2527857

[52] U.S. Cl. .............................. 325/55; 325/395; 343/228
[51] Int. Cl.² .......................................... H04B 1/06
[58] Field of Search ............... 343/200, 225, 228; 325/48, 55, 321, 346, 419, 478, 392, 395; 340/171 R, 171 PF; 329/122; 179/15 BT

[56] References Cited

UNITED STATES PATENTS

| | | | |
|---|---|---|---|
| 3,628,153 | 12/1971 | Fukata | 325/395 |
| 3,657,655 | 4/1972 | Fukata | 343/228 |
| 3,755,744 | 8/1973 | Fukata | 325/392 |
| 3,792,199 | 2/1974 | Saeki | 325/48 |
| 3,921,076 | 11/1975 | Currie | 325/321 |
| 3,922,607 | 11/1975 | Wysong | 325/48 |
| 3,949,401 | 4/1976 | Hegeler | 343/200 |
| 3,995,220 | 11/1976 | Hansen | 325/478 |

Primary Examiner—Robert L. Griffin
Assistant Examiner—Michael A. Masinick
Attorney, Agent, or Firm—William R. Woodward

[57] ABSTRACT

A frequency recognition circuit includes a first phase locked loop to detect the carrier tone frequency, which locks to the detected frequency and provides the frequency-modulation frequency to a second PLL for modulation frequency recognition. When the predetermined carrier and modulation frequencies are recognized, an AND-gate provides a signal that removes a short-circuit from a capacitor that then begins to charge through a time constant circuit. The time constant circuit triggers a threshold switch after a period determined as the minimum duration for a signal and the threshold switch operates to advance a flipflop which performs a switching function and, at the same time, changes the time constant circuit so that the threshold switch will operate the next time on a signal of a different minimum duration. The decoder is designed to switch the output of a radio receiver on and off for selectively listening to traffic announcements.

6 Claims, 3 Drawing Figures

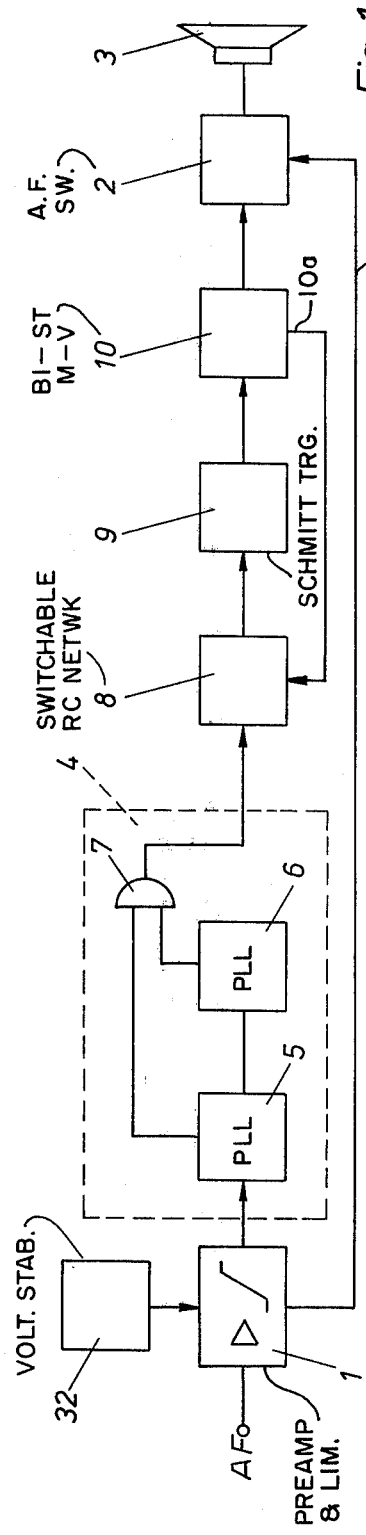
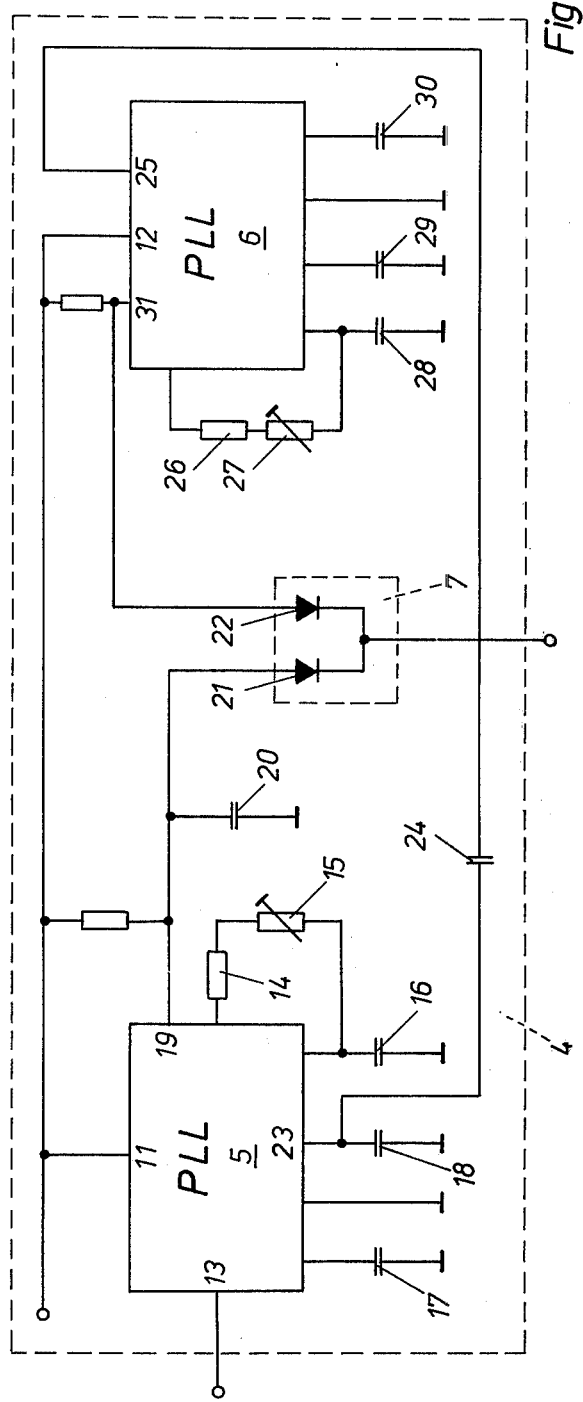
Fig. 1
Fig. 2

DECODER FOR FREQUENCY-MODULATED TONES OF TWO DIFFERENT LENGTHS

The invention relates to a decoder for frequency modulated control signals of fixed carrier and modulation frequency and of two different signal lengths which are used in alternating sequence of signal length, and particularly for such control signals as are used to control the start and stop of an automatic switching operation in a radio receiver.

In the Federal Republic of Germany, broadcast stations, both AM stations and FM stations, periodically radiate traffic announcements and radiate suitable identification frequencies, so that the receivers in vehicles can respond to the traffic announcements in a way that will ring particular attention to the announcement, or even override some other use of the receiving equipment in the vehicle. The manner of operation of this traffic announcement system is described in U.S. Pat. No. 3,949,401, assigned to the assignee of the present application, and in a number of publications cited in the introduction to the specification of that patent. As explained in the aforesaid patent, when an FM broadcast transmitter is used, a pilot subcarrier frequency of 57 kHz is generally used for the control signals with modulation frequencies in the audible range.

It is desirable in some cases, and particularly for AM broadcast transmitters, to utilize a carrier frequency in the audible range. In Germany, for instance, a carrier frequency of 2.35 kHz has been selected and is frequency-modulated at 123 Hz to provide a start signal of a duration of one second at the beginning of each traffic message and a stop signal of a duration of one-half second at the end of each traffic message. These start and stop signals are then useable to control the initial and final switching operations that may be necessary in a mobile radio receiver to give the traffic signal appropriate treatment.

The presence of these control signals make it possible to receive the traffic signals without theretofore and thereafter having to listen to the normal radio broadcast program. Heretofore, the evaluation circuits for response to these signals have been incorporated in so-called infobanks ("Infotheken") that consist of remotely controlled tape recorder and playback equipment that are switched on and off by the radio broadcast signals so as always to pick up the most recent traffic advice. The infobanks are established at expressway service areas where any driver stopping there can listen to the most recent traffic advice if he is interested. The known decoders incorporated in the infobanks for automatically recording the most recent information have relatively high electric power requirements. That is not a critical matter for an infobank installation, because sufficient electric power is available and can be drawn from the commerical or official power network for the purpose.

Since the control signals above referred to, or others similarly constituted, are in the audible range of the human ear and appear directly in the audio signal of the broadcast station, they are suitable as recognition signals for other messages, for example for disaster warnings and the like. With control signals constituted in a similar manner, encoded messages of more than regional significance can be simultaneously broadcast over a very large service area.

For reception of such messages with battery operated portable radio receivers, it is necessary to provide a decoder with the smallest possible power consumption in order to accomplish the appropriate control function.

In one known form of decoder for recognizing control signals, a considerably expensive recognition circuit is used. Among other components, it contains a selective amplifier state, a filter for the carrier frequency of the control signal, a filter serving as a slope circuit demodulator and an active filter for the modulation frequency. Furthermore, in this recognition circuit a differential amplifier stage and a stage for obtaining a d-c control voltage are necessary. On account of these many switching stages and the components necessary for them, the decoder has a very considerable electric power requirement.

It is an object of the present invention to provide a decoder that has the smallest possible power requirement.

SUMMARY OF THE INVENTION

Briefly, the recognition circuit for the carrier and modulation frequencies of the FM control signal is constituted of two phase locked loops and an AND-gate, the voltage controlled oscillator of the first of these PLLs being tuned to the carrier frequency and that of the oscillator of the second PLL to the modulation frequency of the control signals. A connection from a point in the first PLL following the phase comparator therein goes to an input of the phase comparator of the second PLL, so that the two PLLs can operate in cascade and both of the PLLs have outputs for an indication that the oscillator is locked in step with an input signal to the phase comparator, these outputs being provided to the respective inputs of the AND-gate. The output of the AND-gate is the output of the recognition circuit, which is then supplied to a timing circuit, the output of which operates a threshold switch, typically a Schmitt trigger, which controls the state of a bistable circuit that performs the desired switching function and also feeds an output back to switch over the timing characteristic of the timing circuit from one value to another. Thus, once a start signal has been recognized by its frequencies and its timing, and the necessary switching operation for hearing the traffic message has been initiated, the timing circuit is switched over to a different timing for subsequently recognizing the stop signal. When the stop signal arrives, it is then recognized by its frequencies and its duration and both the receiver circuits and the timing circuit are switched back to the normal condition in which a traffic message is not being received.

It is particularly desirable to provide a bypass capacitor between equipment ground and the connection between the output of the first (carrier) PLL and the corresponding input to the AND-gate to reduce transient response.

It is particularly advantageous to provide the timing circuit with an RC series circuit with the supply voltage applied to the resistive portion and with the capacitive terminal grounded and to have the capacitor connected in parallel to the switching path of a first switching transistor that has its control terminal connected to the output of the recognition circuit. It is further desirable to provide the switching of the timing circuit by providing the resistive portion of the RC circuit in the form of two resistors in series, of which one, preferably the one connected to the capacitor, is in parallel with the switching path of a second switching transistor that has its control terminal connected to an output of the bistable circuit that performs the switching function for the traffic message.

Finally, it is preferred to constitute the PLLs, the threshold switch and the bistable ciruclt in the form of CMOS integrated circuitry. The invention is further described by way of example with reference to the accompanying drawings, in which:

FIG. 1 is a block diagram of a decoder according to the present invention;

FIG. 2 is a circuit diagram of the recognition circuit of a decoder in accordance with FIG. 1, and FIG. 3 is a circuit diagram of a timing circuit useable in the circuit of FIG. 1. A complete audio frequency signal obtained from the normal demodulator of a broadcast receiver provides the signal input of FIG. 1 at the terminal AF. This signal is supplied to a preamplifier and limiter stage 1, of which the output is provided to a terminal of an audio frequency switch 2 through which it is switchable to the loudspeaker 3. The audio frequency signal is also supplied by the preamplifier and limiter 1 to the input of a frequency recognition circuit 4. The audio frequency signal from time to time contains a control signal of a frequency of 2.35 kHz frequency modulated at 123 Hz that is provided at a signal level about 26 dB below the normal program signal level, this control signal being transmitted before and/or after a traffic message. This control signal reaches the frequency recognition circuit 4 after being symmetrically limited and amplified in the circuit 1.

The frequency recognition circuit 4 contains principally two phase locked loop (PPL) circuits 5 and 6.

A PLL, as is known, is made up of four basic components, a phase comparator, a low pass filter and an amplifier in the main branch and a voltage controlled oscillator (VCO) in the feedback branch. Its mode of operation is that a frequency to be recognized is set into the VCO as the idling frequency and an input signal provided to one input of the phase comparator is compared to the momentary frequency of the VCO, with the difference between the two signals providing a control magnitude which is processed in the low pass filter and the amplifier in such a way that a correcting control voltage may thereby be supplied to the VCO. By means of this modifying control voltage, the output frequency of the VCO is pulled towards the input frequency provided to the phase comparator, within a so-called capture frequency range. A PLL is said to be locked-in if the frequency of the VCO follows the input frequency supplied to the phase comparator.

The first PLL 5 of the frequency recognition circuit 4 is tuned to a frequency of 2.35 kHz as the idling frequency, the second to a frequency of 123 Hz. Each of the PLLs 5 and 6 has an output capable of indicating when the PLL is locked in and these two outputs are respectively connected to the inputs of an AND-gate 7. The manner of operation of the two PLLs is further described below with reference to FIG. 2.

If both of the PLLs 5 and 6 are locked in to input signals within their capture/holding frequency ranges, an output is provided by the AND-gate 7 signifying recognition of a control signal which is then provided to a switchable timing circuit 8 to initiate a capacitor charging cycle in an RC network.

When a predetermined charge voltage is reached in the capacitor of the network, a threshold switch, in this case a Schmitt trigger circuit 9, is caused to operate, which sets the bistable multivibrator 10 into its other state (off-normal, — the absence of a traffic message being considered the normal condition). The switching over of the bistable multivibrator 10, by an output provided over the connection 10a switches over the timing circuit 8 from one timing characteristic to another and, at the same time, over a connection 10b operates the audio frequency switch 2 so that the audio signal provided over the connection 1a is applied to the loudspeaker 3 and thereby becomes audible. The switchable timing circuit 8 is described further below with reference to FIG. 3.

In the example just described, the audio frequency was switched off from the loudspeaker 3 by the audio frequency switch 2 prior to reception of the control signal. Of course, the audio frequency switch 2 is also equipped (by means not shown) to be switched manually, so that during periods in which there are no traffic messages being transmitted, the normal radio broadcast program can be listened to if that is desired.

It is to be noted that the Schmitt trigger circuit 9, the bistable multivibrator 10 and both PLLs 5 and 6 are preferably constituted in the form of CMOS integrated circuitry, which is a form of circuitry having low power requirements, so that the bulk of these control circuits have a very small power consumption of their own. A voltage stabilizer circuit 32 is provided to supply the individual components of the decoder with stabilized voltages.

FIG. 2 shows the constitution of the frequency recognition circuit 4 according to the invention. Its principal components are the phase locked loop circuits 5 and 6, these being provided in integrated circuit form. In the illustrated example, PLLs of type NE 567 are utilized the internal constitution of which may be found described in the data book "Phase Locked Loops" published by the Signetics company. A stabilized supply voltage is provided to the PLLs 5 and 6 through their supply voltage input connections 11 and 12.

The audio frequency signal which from time to time contains a control signal is connected to the input 13 of the PLL 5, this input being the signal input of the phase comparator of the PLL 5, the internal components of the PLLs not being shown in FIG. 2. The RC network composed of the resistors 14 and 15 and a capacitor 16 tunes the VCO (not shown) of the PLL 5, the adjustable resistor 15 being adjusted so that the VCO is tuned to the frequency of 2.35 kHz. The capacitors 17 and 18 are of respective capacitances chosen to set the desired frequency regions for capture and holding (i.e. for establishing and maintaining the locked-in condition) at a suitable frequency range magnitude. In the illustrated example, these are chosen so that the capture range will be about 150 Hz (2,350 ± 75 Hz).

When the PLL 5 is locked in, that is, when the oscillator frequency follows the frequency applied at the input 13, a digital signal is produced that is available at the output 19 of the PLL 5, that jumps from a signal condition H, for no lock-in to, a signal condition L present during lock-in. In order that momentary recognitions of the frequency 2.35 kHz that may occur when this frequency appears in a normal radio broadcast program, should not be confused with control signals, a bypass capacitor 20 of relatively large capacitance is connected between the output terminal 19 of PLL 5 and equipment ground for bypassing of transients. Only when the PLL 5 remains locked in for a relatively longer time does the lock-in information get transferred from the terminal 19 to a first input of the AND-gate 7 that consists of diodes 21 and 22. In this manner, a sufficiently high margin of safety against false indications is obtained.

When the PLL 5 is locked in, the control signal present at the output of the low pass filter element (not shown) in the PLL 5, appearing at output terminal 23, has the frequency of 123 Hz in already demodulated form, because the 2.35 kHz frequency is frequency modulated at 123 Hz. This control signal from the output terminal 23 of the PLL 5 is connected through a coupling capacitor 24 to an input 25 of the PLL 6, which is in fact the signal input of the phase comparator (not shown) of the PLL 6.

The VCO of the PLL 6 is tuned to an idle oscillator frequency of 123 Hz by an RC network composed of resistors 26 and 27 and a capacitor 28. The holding frequency range and the capture frequency range of the PLL 6 are set by appropriate electrical dimensions of the capacitors 29 and 30. The capture range is about 6 Hz.

When the PLL 6 is locked in, a digital signal appears at its output 31 that changes over from a condition H in the absence of lock-in to a signal condition L during lock-in. This digital signal is supplied to the second input of the AND-gate 7. When the condition L is present at both inputs of the AND-gate 7, both diodes 21 and 22 are blocked and this information is utilized in the timing circuit 8 which is a switchable time constant network. Simultaneous blocking of the two diodes 21 and 22 can only occur when for a sufficiently long time a frequency of 2.35 kHz appears which is, moreover, frequency modulated at 123 Hz. This assures to a high degree of probability that no incidental appearance of particular frequencies in broadcast program material will produce a false operation.

The timing circuit 8 will now be described with reference to FIG. 3. As already pointed out above, just before a traffic announcement, a control signal with a duration of 1 sec. is transmitted and after the announcement, a control signal of 0.5 sec. duration is transmitted. The difference in duration is necessary in order to permit distinction between beginning and end of a traffic announcement in the evaluation of control signals, so that a vehicle that for some reason has not received the start signal will not switch on its receiver to listen to a traffic message when the stop signal comes by, after which there is no message.

The switchable time constant circuit 8 contains a series connection of a first resistor 33, a second resistor 34 and capacitor 35, with one terminal of the capacitor connected to equipment ground and the other end of the series circuit connected to the supply voltage. The switching path of a first switching transistor 36 is connected in parallel to the capacitor 35 and the switching path of a second switching transistor 37 is connected in parallel to the second resistor 34. The first switching transistor 36 is controlled by the output of the recognition circuit 4 and the second switching transistor 37 by an output of the bistable multivibrator 10. The voltage appearing across the capacitor 35 is used to control the switching of the Schmitt trigger circuit 9.

The operation of the switchable timing circuit of FIG. 3 is best explained by considering as the initial condition the situation when no control signal is present. The two diodes 21 and 22 are both then conducting and the signal condition H is applied to the base of the first switching transistor 36, so that it is also conducting and the capacitor 35 is thereby discharged and prevented from accumulating any charge. The second switching transistor 37 at this time is not conducting.

If now the frequency recognition circuit 4 recognizes a control signal, the two diodes 21 and 22 are both blocked and the first switching transistor 36 is, accordingly, likewise blocked. From this moment on, the capacitor 35 charges over the series circuit comprising the resistors 33 and 34. This series circuit is so designed that the capacitor 35 reaches the voltage necessary for switching the Schmitt trigger circuit 9 after about 700 milliseconds. When the Schmitt trigger circuit 9 switches, the bistable multivibrator 10 flops over to its opposite condition. The change of state of the multivibrator 10 closes the audio frequency switch 2 on the one hand and, on the other hand, unblocks the second switching transistor 37, which now short circuits the resistor 34. Exactly upon the termination of the 1 sec. duration control signal, the first switching transistor 36 goes back into the conducting condition and remains therein during the succeeding traffic message, so that the capacitor 35 discharges.

After the traffic message, the control signal of one-half sec. duration appears. At the beginning of this signal, the first switching transistor 36 is again blocked, so a new charging up of the capacitor 35 begins, this time only through the first resistor 33 and the now conducting second switching transistor 37. The switching threshold of the Schmitt trigger circuit 9 is this time already reached after about 300 milliseconds, and the Schmitt trigger 9 causes the bistable multivibrator 10 to flop back to its initial condition, thus switching off the audio output by opening the audio switch 2 and, on the other hand, putting the second switching transistor 37 in the non-conducting condition. The circuit is now back in the condition in which it was initially before the start control signal of the traffic message appeared.

By the choice of the time constants of about 700 milliseconds in one case and 300 milliseconds in the other, the control signals before and after a traffic message are distinguished from each other while at the same time preserving sufficient tolerances to allow the decoder to respond even when the control signals are not received in their full length.

By the utilization of the first switching transistor 36, the margin of safety over false operation from disturbances for the decoder as a whole is raised, because after a brief transient response of the recognition circuit 4 that might possibly occur as the result of frequencies of music or speech that might initiate a beginning of charging of the capacitor 35, the capacitor is quickly and suddenly discharged when the switching transistor 36 again conducts when the transient recognition disappears. Thus, even several brief transient recognition effects will not enable the capacitor 35 to charge up to the switching threshold of the Schmitt trigger circuit, as happens with the RC timing circuits heretofore used for similar purposes.

The design of the frequency recognition circuit 4 and of the switchable time constant circuit 8 in accordance with the present invention provides a probability bordering on full assurance that no frequencies or frequency combinations in broadcast, music or speech will result in an operation of the Schmitt trigger circuit 9.

The particular illustrative example of a decoder according to the invention which is above described is shown as simply operating an audio circuit switch 2 in response to control signals such as are transmitted for traffic message purposes in the West German Federal Republic Radio Broadcast Service. Of course, the decoder can be equipped with auxiliary circuits to provide optical or acoustic recognition signals, so that a person who is not in the immediate neighborhood of a radio receiver can have his attention called to the message. Furthermore, the audio switch could switch the loudspeaker from a cassette player to radio reception and back. Moreover, the decoder can be designed to respond to control signals that relate to coded announcement or message. Thus, the particular carrier and modulation frequencies may differentiate the receivers that will be activated. Also, the decoder may be used to treat a signal of one duration as a space-to-mark transition and a signal of a shorter duration as a mark-to-space transition and thereby operate a following binary decoder.

Although the invention has been specifically described in connection with a particular illustrative example, therefore, variations and modifications are possible within the inventive concept.

I claim:

1. A decoder for coded frequency-modulated control signals of two different lengths used in alternating sequence of signal length, comprising a frequency recognition circuit, a switchable timing circuit responsive to the output of the frequency recognition circuit, a threshold switch circuit responsive to said timing circuit, and a bistable circuit responsive to said switch circuit and having a first output for controlling the switchable timing of said timing circuit and a second output for operating a control function for the operation of which said control signals are useful, and further comprising the improvement wherein:

said frequency recognition circuit (4) comprises two phase locked loops (5,6) and an AND-gate (7), each of said phase locked loops having a voltage controlled oscillator and a phase comparator;

the voltage controlled oscillator of the first phase-locked loop (5) is tuned to the carrier frequency of said FM control signals and the voltage controlled oscillator of the second phase locked loop (6) is tuned to the frequency-modulation frequency of said FM control signals;

a connection is provided from a point in said first phase lock loop (5) following its phase comparator to an input of the phase comparator of the second phase locked loop (6) for supplying frequency modulation detected by said first phase locked loop to said second phase locked loop, and each of said phase locked loops has outputs (19,31) from whch a signal showing a locking-in of the oscillator to an input frequency provided to the loop, each of said outputs being connected to an input of said AND-gate (7), of which the output is the output of the frequency recognition circuit to which said switchable timing circuit is responsive.

2. A decoder as defined in claim 1, in which the respective oscillators of said phase locked loops are both tuned to frequencies in the audible range of the human ear.

3. A decoder as defined in claim 1, in which a bypass capacitor (20) is connected between equipment ground and said output (19) of said first phase locked loop (5) at which recognition of the carrier frequency by lock-in thereto is indicated.

4. A decoder as defined in claim 1, in which both said phase locked loops (5,6), said threshold switch circuit (9) and said bistable circuit (10) are provided in the form of CMOS integrated circuitry.

5. A decoder as defined in claim 1, in which said switchable timing circuit (8) comprises an RC series circuit to which a supply voltage is applied having a capacitor (35) therein whch has one terminal connected to equipment ground, and in which said capacitor (35) is connected in parallel to the switching path of a first switching transistor (36) of which the control electrode is connected to the output of said frequency recognition circuit (4).

6. A decoder as defined in claim 5, in which said RC series circuit comprises two resistors (33,34) of which one (34) is connected in parallel with the switching path of a second switching transistor (37) of which the control terminal is connected to an output of said bistable circuit (10) for controlling the switchable timing of the timing circuit.

* * * * *